(12) United States Patent
Wang

(10) Patent No.: US 12,190,976 B2
(45) Date of Patent: Jan. 7, 2025

(54) METHOD AND DEVICE FOR CHECKING DATA, ELECTRONIC DEVICE, AND STORAGE MEDIUM

(71) Applicant: CHANGXIN MEMORY TECHNOLOGIES, INC., Hefei (CN)

(72) Inventor: Jia Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 279 days.

(21) Appl. No.: 17/854,138

(22) Filed: Jun. 30, 2022

(65) Prior Publication Data

US 2023/0307078 A1   Sep. 28, 2023

Related U.S. Application Data

(63) Continuation of application No. PCT/CN2022/078475, filed on Feb. 28, 2022.

(30) Foreign Application Priority Data

Feb. 8, 2022   (CN) .......................... 202210117836.4

(51) Int. Cl.
  *G11C 29/42*   (2006.01)
  *G11C 29/12*   (2006.01)
  *G11C 29/44*   (2006.01)

(52) U.S. Cl.
  CPC .......... *G11C 29/42* (2013.01); *G11C 29/1201* (2013.01); *G11C 29/4401* (2013.01);
  (Continued)

(58) Field of Classification Search
  CPC ....................................................... G11C 29/42
  (Continued)

(56) References Cited

U.S. PATENT DOCUMENTS

| 5,930,184 A * | 7/1999 | Waller ................... G11C 29/12 |
| | | 365/201 |
| 6,304,502 B1 * | 10/2001 | Watanabe .............. G11C 29/76 |
| | | 365/201 |

(Continued)

FOREIGN PATENT DOCUMENTS

| CN | 102122959 A | 7/2011 |
| CN | 109949854 A | 6/2019 |

(Continued)

*Primary Examiner* — Muna A Techane
(74) *Attorney, Agent, or Firm* — Kilpatrick Townsend & Stockton LLP

(57) ABSTRACT

A method, device for checking data, an electronic device and a storage medium are provided. The method includes operations as follows. A memory array is read to obtain read data, and the read data is compressed to obtain first compressed data. The first compressed data is compared with second compressed data, the second compressed data being obtained by compressing written data corresponding to the read data. In responsive to that the first compressed data is consistent with the second compressed data, whether data of a predetermined bit in the read data is consistent with pre-stored original bit data is detected, to determine whether the read data is correct. It is determined that the read data is correct if the data of the predetermined bit is consistent with the pre-stored original bit data, otherwise it is determined that the read data is incorrect.

17 Claims, 10 Drawing Sheets

(52) U.S. Cl.
CPC ............... *G11C 2029/1202* (2013.01); *G11C 2029/1204* (2013.01)

(58) Field of Classification Search
USPC .................................................. 365/189.05
See application file for complete search history.

(56) References Cited

U.S. PATENT DOCUMENTS

| | | | |
|---|---|---|---|
| 2008/0062775 A1* | 3/2008 | Oh ....................... | G11C 7/1006 |
| | | | 365/189.05 |
| 2011/0161774 A1 | 6/2011 | Shin | |
| 2016/0218739 A1* | 7/2016 | Lee .................... | H03M 7/3066 |
| 2019/0188077 A1 | 6/2019 | Kwon et al. | |

FOREIGN PATENT DOCUMENTS

| | | | | |
|---|---|---|---|---|
| CN | 112380046 A | 2/2021 | | |
| CN | 112395129 A | 2/2021 | | |
| CN | 107193683 B | 5/2021 | | |
| WO | WO-2022100576 A1 * | 5/2022 | .......... | G06F 11/1004 |

* cited by examiner

METHOD AND DEVICE FOR CHECKING DATA, ELECTRONIC DEVICE, AND STORAGE MEDIUM

CROSS-REFERENCE TO RELATED APPLICATION

This is a continuation of International Patent Application No. PCT/CN2022/078475, filed on Feb. 28, 2022, which claims priority to Chinese Patent Application No. 202210117836.4, filed on Feb. 8, 2022. The disclosures of International Patent Application No. PCT/CN2022/078475 and Chinese Patent Application No. 202210117836.4 are hereby incorporated by reference in their entireties.

BACKGROUND

A Dynamic Random Access Memory (DRAM) is a common semiconductor memory device in a computer. Each memory cell in the DRAM includes a capacitor and a transistor. A gate of the transistor is connected with a word line, a drain of the transistor is connected with a bit line, and a source of the transistor is connected with the capacitor. A voltage signal on the word line can control the transistor to be turned on or turned off to read data information stored in the capacitor through the bit line or write data information to the capacitor for storage through the bit line. In each memory cell, the quantity of electric charges stored in the capacitor can be used to represent whether a binary bit is 1 or 0.

SUMMARY

The disclosure relates to the technical field of memories, and particularly to a method and device for checking data, an electronic device, and a storage medium, so as to check data stored in a DRAM accurately.

A first aspect of the embodiments of the disclosure provides a method for checking data, which may be applied to a memory and include the following operations. A memory array is read to obtain read data, and the read data is compressed to obtain first compressed data. The first compressed data is compared with second compressed data. The second compressed data is obtained by compressing written data corresponding to the read data. In response to that the first compressed data is consistent with the second compressed data, whether data of a predetermined bit in the read data is consistent with pre-stored original bit data is detected, to determine whether the read data is correct. It is determined that the read data is correct in response to that the data of the predetermined bit is consistent with the pre-stored original bit data, It is determined that the read data is incorrect in response to that the data of the predetermined bit is inconsistent with the pre-stored original bit data. The original bit data is data of a predetermined bit in the written data corresponding to the read data.

A second aspect of the embodiments of the disclosure provides a device for checking data, which includes a read-write circuit, a compression circuit, and a checking circuit. The read-write circuit is configured to read a memory array to obtain read data. The compression circuit is configured to compress the read data to obtain first compressed data. The checking circuit is configured to compare the first compressed data with second compressed data. The second compressed data is obtained by compressing written data corresponding to the read data. The checking circuit is configured to, in response to that the first compressed data is consistent with the second compressed data, detect whether data of a predetermined bit in the read data is consistent with pre-stored original bit data to determine whether the read data is correct. The checking circuit is further configured to determine that the read data is correct in response to that the data of the predetermined bit is consistent with the pre-stored original bit data, or determine that the read data is incorrect in response to that the data of the predetermined bit is inconsistent with the pre-stored original bit data. The original bit data is data of a predetermined bit in the written data corresponding to the read data.

A third aspect of the embodiments of the disclosure provides an electronic device, which includes a processor and a memory in communication connection with the processor. The memory stores computer-executable instructions. The processor executes the computer-executable instructions stored in the memory to implement the method in the first aspect.

A fourth aspect of the embodiments of the disclosure provides a computer-readable storage medium having stored therein computer-executable instructions which, when executed by a processor, implement the method in the first aspect.

BRIEF DESCRIPTION OF THE DRAWINGS

The accompanying drawings, which are incorporated in and constitute a part of this specification, illustrate embodiments consistent with the disclosure and, together with the specification, serve to explain the principle of the disclosure.

Figure 1:
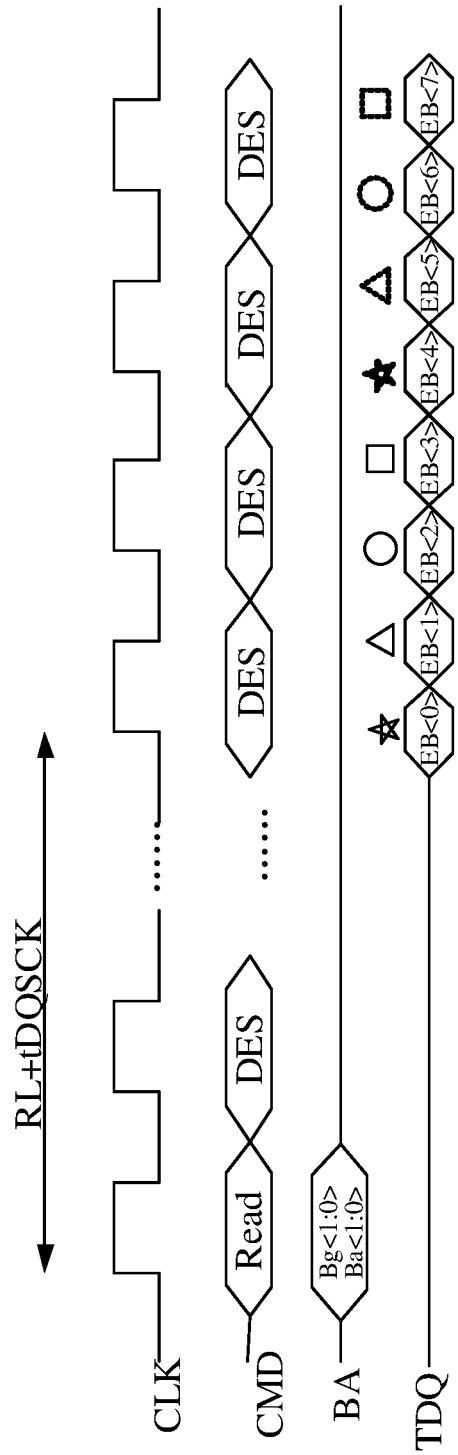
FIG. 1 is an exemplary timing diagram of compressing read data in a DRAM.

The embodiments of the disclosure have been shown in the drawings, and more detailed descriptions will be made hereinafter. These drawings and text descriptions are not for limiting the scope of the concept of the disclosure in any manner but for explaining the concept of the disclosure to those skilled in the art with reference to the specific embodiments.

DETAILED DESCRIPTION

Exemplary embodiments are described in detail, and examples thereof are represented in the drawings. When the following descriptions involve the drawings, the same numerals in different drawings represent the same or similar elements, unless otherwise indicated. Implementations described in the following exemplary embodiments do not represent all implementations consistent with the disclosure. Instead, they are merely examples of a device and method consistent with some aspects of the disclosure.

Terms involved in the disclosure are explained first.

Parity check is a method for checking accuracy of transmitted codes. Check is implemented according to whether the number of "1" in digits of a set of binary codes transmitted is odd or even. It is referred to as odd parity check if the number is odd, and it is referred to as even parity check if the number is even. Which parity check is used is specified in advance. A special parity check bit is set to ensure that the number of "1" in the set of codes is odd or even. If the odd parity check is used, a receiver, when receiving this set of codes, checks whether the number of "1" is odd, to determine the accuracy of the transmitted codes.

In a digital circuit, a minimum data unit is referred to as "bit", or data "bit". "Bit" is also a minimum unit in a memory. The bit represents high-level and low-level signals of data by "1" and "0". In a digital circuit, eight continuous bits constitute a byte. Each byte in the memory without "parity check" includes only eight bits, and if an error occurs in a certain bit in the byte, data stored in the bit may change and an error may occur in an application program. One more bit is added into each byte (eight bits) in an the memory with "parity check" to implement error detection. When returning read stored data, a Central Processing Unit (CPU) adds data stored in the first eight bits in the byte to obtain a calculation result, and determines whether a calculation result is consistent with a check bit. If the calculation result is different from the check bit, the CPU tries to correct these errors.

A DRAM is a common semiconductor memory device in a computer. Each memory cell in the DRAM includes a capacitor and a transistor. A gate of the transistor is connected with a word line, a drain of the transistor is connected with a bit line, and a source of the transistor is connected with the capacitor. A voltage signal on the word line may control the transistor to be turned on or turned off, to read data information stored in the capacitor through the bit line or write data information into the capacitor for storage through the bit line. In each memory cell, the quantity of electric charges stored in the capacitor can be used to represent whether a binary bit is 1 or 0. The memory cells are arranged in a matrix, i.e., a memory array.

In a production process, the DRAM is complex in circuit structure and high in integration level. Therefore, a failure may be caused in the memory cell due to process reasons such as a poor node contact, and the read data is incorrect. Therefore, it is necessary to check data stored in the DRAM during analysis for production process yield.

In practical applications, electric leakage may occur to the transistor of the DRAM. Due to the leakage of the electric charges stored in the capacitor of the memory cell with time, there are no enough electric charges to correctly reflect originally stored data, and generate incorrect read data. That is, the DRAM is limited in data retention. In order to retain information, it is necessary to refresh contents in the memory cells of the DRAM. In order to set a reasonable refresh time, it is necessary to test data retention time of the DRAM and check the data stored in the DRAM.

A possible testing method is to write data to the DRAM, and then read the data, and compare whether the written data is consistent with the read data to determine the accuracy of the data stored in the DRAM. If each piece of data is compared, the operation workload is high, and the detection efficiency is reduced greatly. In order to improve the test efficiency, a compression testing method is proposed. According to this method, whether compressed data corresponding to written data is consistent with compressed data corresponding to read data is compared, to determine the accuracy of data stored in the DRAM.

FIG. 1 is an exemplary timing diagram of compressing read data of a DRAM. CLK is a clock signal, CMD is a command signal, BA is an addressing signal of a BANK in the DRAM, and TDQ is a data signal. In FIG. 1, a BANK storing 256+16 bits of data with a Burst Length (BL) of 8 is taken as an example, one bank compression read test circuit is used, compression processing based on exclusive-order operation is performed on the 256+16 bits of data to form 8 bits of Error Bit (EB) data EB<7:0>. The EB<7:0> is outputted to a TDQ signal port in a parallel-to-serial manner through four-tick CLK. Different compressed data EB is sampled at rising and falling edges of CLK.

However, a condition that read data is all incorrect cannot be determined by the above compression testing method. Exemplarily, the 256+16 bits are set to be repetition of preset eight numbers. The preset eight numbers may be 00000000, namely written data in a write operation is all 0, and eight EBs outputted after an exclusive- or operation is performed on the written data are all 1. Then, a read operation is performed to obtain read data. When the read data is all 0 or 1, eight EBs outputted after an exclusive- or operation is performed on the read data are all 1. Therefore, it is impossible to determine whether the read data is all correct or incorrect in such case.

Based on this, a method and device for checking data, an electronic device and a storage medium are provided, which may check data stored in a DRAM accurately. In addition to comparing compressed data corresponding to written data with compressed data corresponding to read data, uncompressed data at a position in the written data and uncompressed data at a position the read data identical to that in the written data is further extracted and compared, thereby improving accuracy of the data checking.

The technical solution and how the technical solution solves the foregoing technical problem are described below in detail with specific embodiments. The following specific embodiments may be combined with one another. The same or similar concepts or processes are not elaborated in some embodiments. The embodiments are described below in combination with the drawings.

Figure 2:
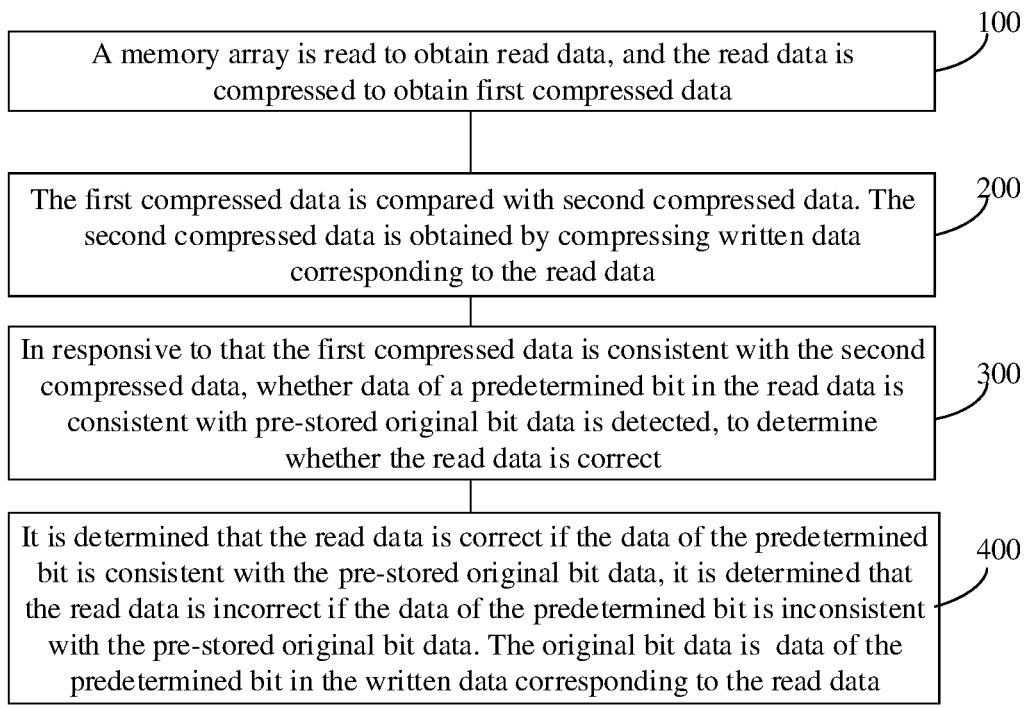
FIG. 2 is a flowchart of a method for checking data method according to an embodiment of the disclosure.

FIG. 2 is a flowchart of a method for checking data according to an embodiment of the disclosure. The method is applied to a memory, and an execution entity of the method may be a device for checking data, or a memory integrated with a device for checking data. Descriptions are made below taking the condition that the execution entity is a device for checking data as an example. As shown in FIG. 2, the method may include the following operations.

In S100, a memory array is read to obtain read data, and the read data is compressed to obtain first compressed data.

In S200, the first compressed data is compared with second compressed data, the second compressed data is obtained by compressing written data corresponding to the read data.

In S300, in response to that the first compressed data is consistent with the second compressed data, whether data of a predetermined bit in the read data is consistent with pre-stored original bit data is detected, to determine whether the read data is correct.

In S400, it is determined that the read data is correct in response to that the data of the predetermined bit in the read data is consistent with the pre-stored original bit data, it is determined that the read data is incorrect in response to that the data of the predetermined bit in the read data is inconsistent with the pre-stored original bit data. The original bit data is data of the predetermined bit in the written data corresponding to the read data.

Optionally, in S100, the read data may include only data bits. The data bits are test data for data checking. The test data may be preset according to a certain rule, for example, set to all be 0 or 1, or may be discrete binary data generated randomly, or may be a memory array obtaining by arranging 0 and 1 according to a certain rule. The arrangement rule of 0 and 1 may be set according to an experimental purpose. Specifically, the arrangement rule of 0 and 1 may be adjusted, to provide a relatively strict or loose testing environment.

Optionally, in S100, the read data may include data bits and a check bit. The check bit is calculated according to the data bits. Specifically, the check bit may be generated based on parity check, or Error Correcting Code (ECC) check, or Cyclic Redundancy Check (CRC).

The check bit is written into the memory array together with the data bits. Correspondingly, the check bit is read out together with the data bits when the memory array is read. Here, a case that an error occurs in the check bit is not excluded. The number of the check bits may be increased to improve the fault tolerance. In practical applications, ECC includes more check bits compared with parity check, and thus is higher in fault tolerance. In addition, the read data includes the check bit, and error data may be corrected by the check bit. Reference may be made to related art regarding a method for correcting a detected error bit, and the method is not specifically introduced herein.

It is to be noted that, in a data transmission process, one or more frames transmitted on a link may be damaged, that is, a bit error occurs, for example, 0 changes to 1, or 1 changes to 0, such that a receiver receives error data. In order to improve the accuracy of data received by the receiver, error detection is performed on the data before the receiver receives the data, and the receiver receives the data only if a detection result indicates that the data is correct. In the above-mentioned parity check, ECC checking, CRC, etc., the check bit is set to implement error detection.

Specifically, in S200 and S300, the first compressed data is obtained by compressing the read data, and the second compressed data is obtained by compressing the written data corresponding to the read data. Compared with performing bit-wise comparison between original bit data in the written data and original bit data in the read data, checking performed based on the compressed data reduces a data size in comparison, and improves the testing efficiency greatly.

Furthermore, when the compressed data corresponding to the read data is correspondingly consistent with the compressed data corresponding to the written data, a condition that incorrect ⊕ incorrect=correct (⊕ represents an exclusive- or operation) may occur during the compression process based on exclusive- or operation, for example, a compression result of data bits of all 0 and a compression result of data bits of all 1 are all 1, so a case that the read data is all incorrect is impossible to be determined. Therefore, original bit data at a position in the written data and original bit data at a position in the read data same as the position in the written data is compared for further determination. When the extracted and compared original bit data in the written data and the read data are inconsistent, it indicates that the read data is incorrect. Otherwise, it indicates that the read data is correct. Compared with comparing compressed data only, the case that the read data is all incorrect can be determined, thereby improving the accuracy for data checking. Compared with performing bit-wise comparison between original bit data in the written data and original bit data in the read data, though two determination operations are executed, the data amount to be processed is far smaller than that in the bit-wise comparison, thereby improving the testing efficiency.

The method provided in the embodiment of the disclosure further includes the following operations. The written data is compressed to obtain the second compressed data. The data of the predetermined bit in the written data is extracted. The second compressed data and the data of the predetermined bit in the written data are stored, and the written data is written to the memory array.

For timing of storing the second compressed data corresponding to the written data and the data of the predetermined bit, optionally, before the written data is written into the memory array, the written data is compressed to obtain the second compressed data, the data of the predetermined bit is selected, and the second compressed data and the data of the predetermined bit are stored in a register or the memory array. Alternatively, when the written data is written into the memory array, the second compressed data corresponding to the written data and the data of the predetermined bit are stored in the register or other memory array. In the embodiment of the disclosure, timing of obtaining and storing the second compressed data corresponding to the written data and the data of the predetermined bit is not limited as long as the data required is obtainable when comparison in S200 to S400.

Optionally, the second compressed data corresponding to the written data and the data of the predetermined bit may be stored in a register of a peripheral circuit inside a DRAM chip, which improves an integration level of the device for checking data. Alternatively, the data may be stored in a register outside the DRAM chip, which allows more data to be stored. Alternatively, the data may be written into the memory array of the DRAM chip.

In practical applications, when spaces of both the register and the memory array of the DRAM chip are relatively small, the register outside the DRAM chip may be selected for storage. When a memory space of the DRAM chip is sufficient, the register or the memory array inside the DRAM chip may be selected for storage. The positions for storing the second compressed data corresponding to the written data and the data of the predetermined bit are not limited in the embodiment of the disclosure.

Furthermore, since the first compressed data is compared with the second compressed data, identical compression calculation methods are performed on the first compressed data and the second compressed data. The compression of the written data or the read data may be implemented by a logic circuit, or a program code.

A compression process is described below taking the compression of the written data as an example.

In an example, the operation that the written data is compressed to obtain the second compressed data includes the following operations. The written data is divided into multiple parts of data according to a data amount of the second compressed data. Compression processing based on the exclusive- or operation is performed on each bit of data in each part of data to obtain compression results of the multiple parts of data. The compression result includes 1-bit data. The second compressed data is obtained according to the compression results of the multiple parts of data.

Specifically, a memory BANK having a bit line BL=8 is taken as an example. The written data is, for example, 256+16 bits data, namely including 256-bit data bits and generated 16-bit check bits. A compression ratio is, for example, 34:1, that is, the data amount of the second compressed data is 8 bits. The 255+16 bits written data is divided into eight parts, and each part of data may be the same or different in data amount. An exclusive- or operation is performed on each part of data to obtain a 1-bit exclusive- or result EB. Therefore, the eight parts of data correspond to eight exclusive- or results, denoted as EB0 to EB7, to form the second compressed data.

In a practical test, a proper compression ratio may be set freely according to requirements for the test speed and the accuracy, which is not limited in the embodiment of the disclosure. The amount of the written data may be set adaptively according to the DRAM chip to be tested, which is not limited in the embodiment of the disclosure.

Based on the above example, the operation that compression processing based on the exclusive- or operation is performed on each bit data in each part of data to obtain compression results of the multiple parts of data includes the following operations. Each part of data is divided into multiple parts of sub-data. A data amount of each part of sub-data is equal to that corresponding to each burst in the memory array. For each part of sub-data, an exclusive- or operation is performed on each bit of data in the sub-data to obtain an intermediate compression result of the sub-data. For each part of data, an exclusive- or operation is performed on the intermediate compression results of the multiple parts of sub-data of the part of data, to obtain the compression results of the multiple parts of data.

Specifically, based on the division of the (256+16) bit written data into eight parts, each part of data is divided into multiple parts of sub-data. Taking BL=8 as an example, each part of sub-data includes a data amount corresponding to a burst, i.e., 8 bit. In such case, the data amount of each part of data is a multiple of 8 bit. If data of the data amount corresponding to a burst is taken as a Column Plane (CP), the (256+16) bit written data is divided into 34 parts of sub-data, and compression based on the exclusive- or operation is performed on each bit of data in each part of sub-data to generate a 1-bit intermediate compression result, recorded as CP0 to CP33.

Furthermore, the exclusive- or operation is performed on CP0 to CP3 to obtain 1-bit second compressed data, i.e., EB<0>=CP0⊕CP1⊕CP2⊕CP3 (⊕ represents exclusive- or operation). The number of CPs corresponding to EB is an integer.

In the practical test, the amount of data in the sub-data may be set adaptively according to a burst length of the DRAM chip to be tested, which is not limited in the embodiment of the disclosure. The number of CPs corresponding to each EB and participating in exclusive- or calculation is not limited in the embodiment of the disclosure.

In an example, after S100, a read error is determined in responsive to that the first compressed data is inconsistent with the second compressed data. It is easily understood that, when the first and second compressed data are inconsistent, it indicates that original bit data corresponding to the compressed data is partially incorrect. Furthermore, in order to locate an error bit, bit-wise comparison may be performed between original bit data of the written data and original bit data of the read data, or more compressed data (with a low compression ratio) may be set to further reduce a range of the error bit. The above checking by comparing the compressed data reduces the data amount involved in comparison, and improves the test rate greatly.

Optionally, simple data may be set as the test data. For example, when the written data is all 0 or 1, an EB<7:0> of the second compressed data may be obtained easily, and in the practical test, the second compressed data may be directly given without performing the above-mentioned compression calculation. Therefore, the calculation time is shortened greatly, and the testing efficiency is improved. In addition, it facilitates the rapid location of an EB. If the written data is all 0, a bit 1 in the read data is an error bit. Certainly, it is not excluded that the error bit is not displayed due to twice flipping. The checking accuracy may be improved by multiple tests.

When the test data is set, it is necessary to ensure that results outputted when the read data is all correct and partially incorrect are different. Specifically, when the read data is partially incorrect, the incorrect bit may be detected by a comparison logic circuit. For example, when the read data is all correct, the comparison logic circuit outputs 1 to represent that checking is passed. When the read data is partially incorrect, the comparison logic circuit outputs 0 to represent that checking is failed. However, when the read data is all incorrect, the comparison logic circuit may output an error result. That is, when the read data is all incorrect, 1 is outputted. Alternatively, 0 represents that checking is passed, and 1 represents that checking is failed.

Figure 3:
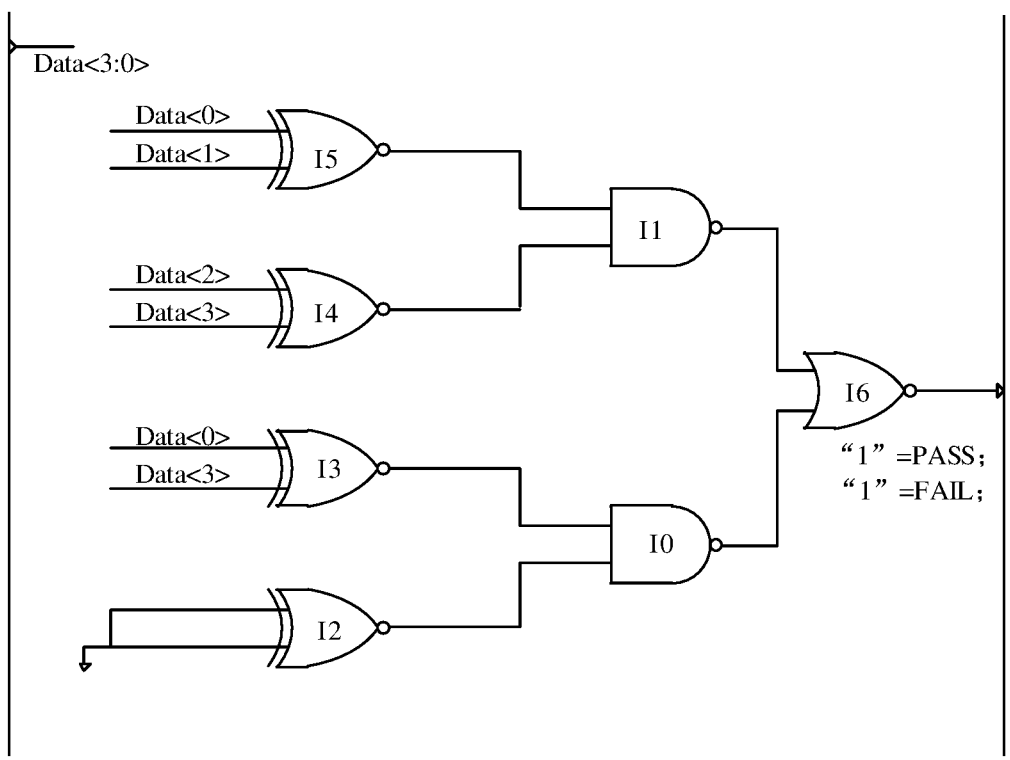
FIG. 3 is a circuit diagram of a comparison logic circuit according to an embodiment of the disclosure.

Exemplarily, FIG. 3 is a circuit diagram of a comparison logic circuit according to an embodiment of the disclosure, which is applied to a test scenario where it is known that written data is all 0 or 1. In the logic circuit shown in FIG. 3, Data<0> and Data<1> are inputted into an input end of an exclusive-not- or circuit 15, and Data<2> and Data<3> are inputted into an input end of an exclusive-not- or circuit 14, Data<0> and Data<3> are inputted into an input end of an exclusive-not- or circuit 13. An exclusive-not- or circuit 12 is a redundant circuit, output end of which is 1, thereby achieving layout symmetry. For the exclusive-not- or circuit, when values of the input ends are identical, an output is 1, and when the values of the input ends are different, the output is 0. Outputs of output ends of the exclusive-not- or circuits 15 and 14 are inputted into a not- and circuit I1. Output of output ends of the exclusive-not- or circuits 13 and 12 are inputted to a not- and circuit I0. Outputs of output ends of the not- and circuits I1 and I0 are inputted to a not- or circuit 16. The not- or circuit 16 outputs 1 or 0 to represent that the read data is correct or incorrect.

It can be seen from FIG. 3 that the logic circuit is configured to output 1 to represent that checking is passed and output 0 to represent checking is failed. It is to be noted that a similar logic circuit may also be set to output 0 to represent that checking is passed and output 1 to represent that checking is failed, which is not limited in the disclosure.

It can be seen from the analysis on the logic circuit that the logic circuit outputs 1 when Data<3:0> is all 0 or 1, otherwise outputs 0. That is, the read data does not pass checking when being partially incorrect, and may pass checking when being all correct or incorrect. In such case, it is necessary to further obtain a value of any data of Data<3:0> to determine whether the data is all correct or incorrect.

When the first compressed data is consistent with the second compressed data, considering the influence of the exclusive- or operation during compression on the analysis on conditions that the read data is all incorrect and correct, the comparison on the data of the predetermined bit in S300 is performed. Multiple bits of uncompressed original bit data are checked, and if inconsistent error data is extracted, it may indicate that the first compressed data EB does not satisfy a condition that the data is all correct.

Figure 4:
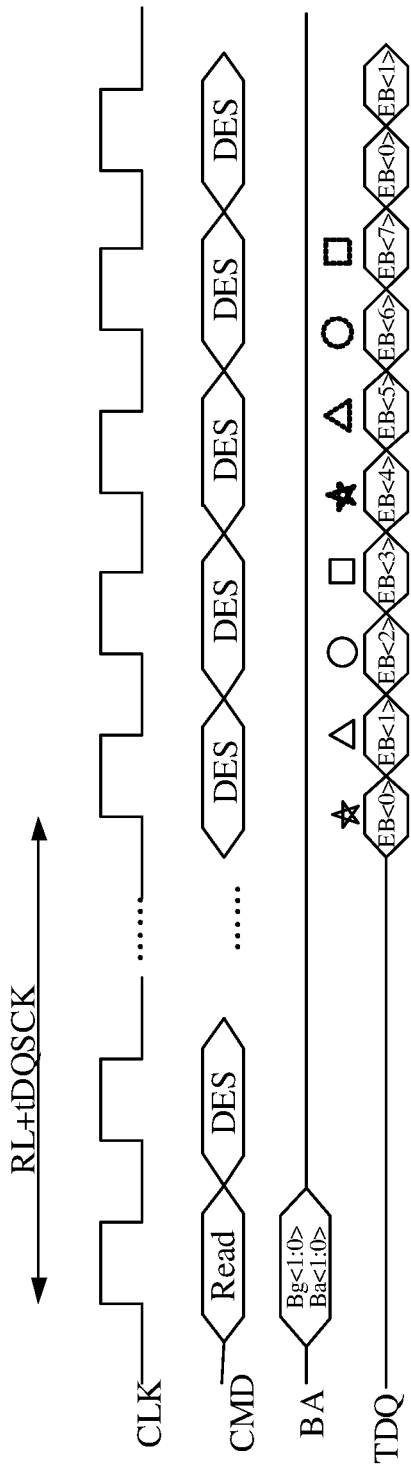
FIG. 4 is a timing diagram of compressing read data in a DRAM according to an embodiment of the disclosure.

FIG. 4 is a timing diagram of compressing read data of a DRAM according to an embodiment of the disclosure. Compared with FIG. 1, after eight bits of EB data EB<7:0> are compressed and read, two bits of Burst Bit (BB) data BB<1:0> are added in the data signal TDQ in FIG. 4. In FIG. 4, the EB data is the first compressed data, and the BB data is the data of the predetermined bit, i.e., original bit data. The BB data is some bits in the read data, that is, the BB data is not subjected to an exclusive- or logic. The condition that the data in the memory array is all incorrect is determined by checking the outputted original bit data.

When a smaller amount of BB data is extracted, an error may occur in a reading process, so the read data may still be correct even if the stored data is all incorrect. That is, multiple bits of original bit data are needed for checking. When a larger amount of BB data is extracted, the probability of extracting error data is higher, and the test time is prolonged. The amount of the extracted BB data is not limited in the embodiment of the disclosure, and the test efficiency, the accuracy and other problems need to be considered comprehensively in the practical test.

In order to balance the test time and the test coverage, part of data is selected to be outputted through a test mode.

In a possible implementation, any burst data is randomly extracted as data of the predetermined bit. This mode is simpler and more convenient.

Figure 5:
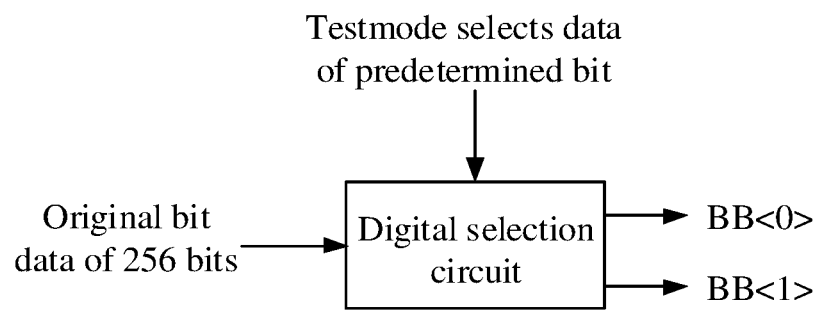
FIG. 5 is a flowchart of obtaining original bit data according to an embodiment of the disclosure.

In a possible implementation, a bit of which an error rate exceeds a predetermined threshold is determined by simulation testing according to sample data. The bit of which the error rate exceeds the predetermined threshold is determined as the predetermined bit. FIG. 5 is a flowchart of obtaining original bit data according to an embodiment of the disclosure. Exemplarily, in the test mode, two bits of original bit data are selected from multiple bits of original bit data as BB data by a data selection circuit. Specifically, historical data error records may be obtained in a simulation test mode, to obtain and output BB data in a region with more errors. BB data is preferably obtained from a bit with a high error rate, and a position with a high error rate is pertinently detected, which is more favorable for extracting error data, and contributes to improving the accuracy of data checking and the detection efficiency.

For the selection of the BB data, BB data is selected when data is written, and BB data at the same position as the selected BB data is read for comparison when data is read. Alternatively, BB data is selected when data is read, and then BB data is extracted from the written data, and in such case, the written data needs to be stored in the register in advance so as to be accessed and extracted anytime. Alternatively, the written data is set to be preset default data, such as all 0 or 1, and thus may be obtained without real-time access.

The extracted BB data may be written to the register when data is written, or may be a preset default value. For example, when the written data is all 0 or 1, it is unnecessary to extract BB data from the written data. Therefore, checking operations may be simplified, and the testing efficiency may be improved.

Furthermore, the original bit data is stored in a register. Specifically, in a possible implementation, the original bit data may be stored in a register outside the DRAM. In another possible implementation, a register is added to a peripheral circuit inside the DRAM chip, the original bit data (BB data) is stored in the register of the peripheral circuit inside the DRAM, and the data checking device is further integrated into the DRAM, thereby facilitating the improvement of a data checking function of the DRAM. In practical applications, the amount and storage positions of the original bit data (BB data) to be deposited are coordinated in consideration of a die size, memory space, and other aspects of the DRAM.

Figure 6:
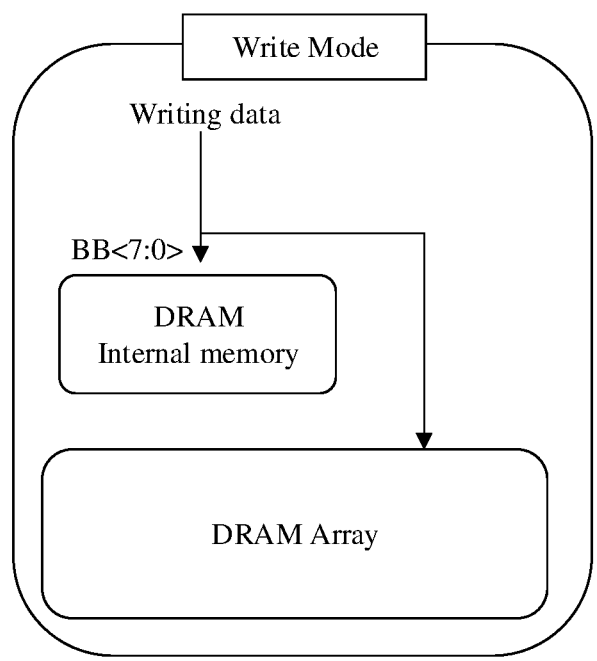
FIG. 6 is a flowchart of a method for checking data under a write operation according to an embodiment of the disclosure.
Figure 7:
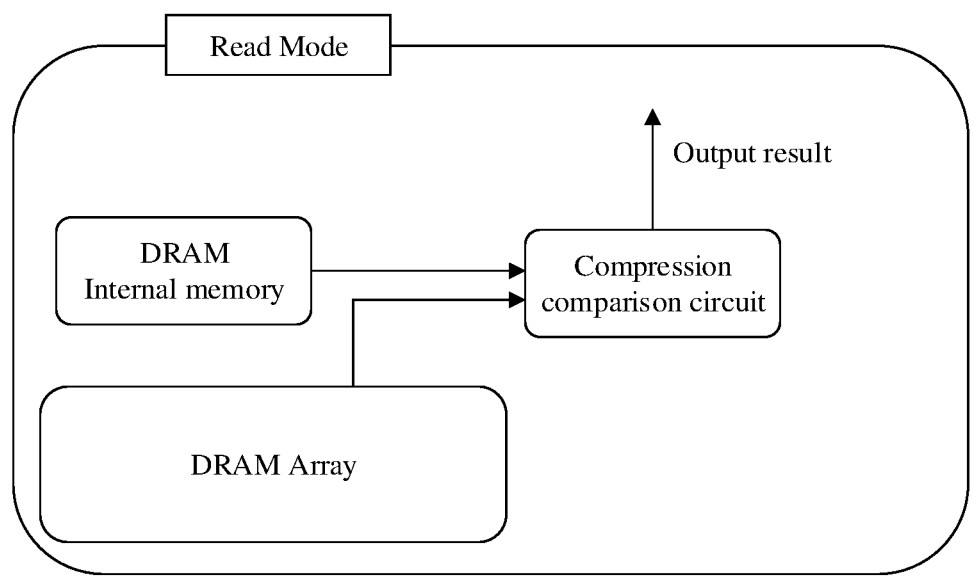
FIG. 7 is a flowchart of a method for checking data under a read operation according to an embodiment of the disclosure.

FIG. 6 is a flowchart of a method for checking data under a write operation according to an embodiment of the disclosure. When test data written from external is written into the memory array (Array) of the DRAM, data BB<7:0> of a burst length in the test data written from external is written to an internal register of the DRAM. FIG. 7 is a flowchart of a method for checking data under a read operation according to an embodiment of the disclosure. When data is read from the memory array (Array) of the DRAM, BB data stored in the DRAM is read and compared with the read data by a comparison circuit. Error information is output in a case that the BB data is inconsistent with the read data. In the embodiment of the disclosure, in addition to comparing the compressed data corresponding to the written data and the compressed data corresponding to the read data, original bit data of a predetermined bit in the written data and original bit data of a predetermined bit in the read data is further extracted and compared in a case that the compressed data corresponding to the written data and the read data are consistent, to further determine whether the read data has an error, thereby improving the accuracy of data checking.

In summary, according to the method for checking data provided in the embodiment of the disclosure, a memory array is read to obtain read data, and the read data is compressed to obtain first compressed data. The first compressed data is compared with second compressed data obtained by compressing written data corresponding to the read data. If the first compressed data is consistent with the second compressed data, whether data of a predetermined bit in the read data is consistent with data of the predetermined bit in the written data corresponding to the read data is detected to determine whether the read data is correct. If the data of the predetermined bit in the read data is consistent with the data of the predetermined bit in the written data, it is determined that the read data is correct, otherwise it is determined that the read data is incorrect. According to the embodiments of the disclosure, the compressed data corresponding to the written data and the compressed data corresponding to the read data are compared, and the data at the same position in the written data and the read data is extracted and compared, thereby improving the accuracy for checking data stored in the memory array.

A device, an electronic device and a storage medium corresponding to the method for checking data provided in the embodiment of the disclosure are described below, and effects thereof may refer to the method part.

Figure 8:
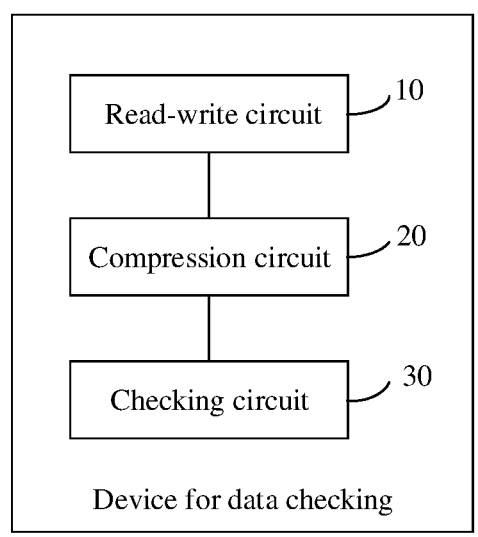
FIG. 8 is a schematic structural diagram of a device for checking data according to an embodiment of the disclosure.

FIG. 8 is a schematic structural diagram of a device for checking data according to an embodiment of the disclosure. The device includes a read-write circuit 10, a compression circuit 20, and a checking circuit 30. The read-write circuit 10 is configured to read a memory array to obtain read data. The compression circuit 20 is configured to compress the read data to obtain first compressed data. The checking circuit 30 is configured to compare the first compressed data with second compressed data. The second compressed data is obtained by compressing written data corresponding to the read data. The checking circuit 30 is further configured to detect, in a case that the first compressed data is consistent with the second compressed data, whether data of a predetermined bit in the read data is consistent with pre-stored original bit data to determine whether the read data is correct. The checking circuit 30 is further configured to determine, if the data of the predetermined bit is consistent with the pre-stored original bit data, that the read data is correct, and determine, if the data of the predetermined bit is inconsistent with the pre-stored original bit data, that the read data is incorrect. The original bit data is data of the predetermined bit in the written data corresponding to the read data.

Optionally, the read data may include only data bits. The data bits are test data for data checking. The test data may be preset according to a certain rule, for example, set to all be 0 or 1, or may be discrete binary data that is generated randomly.

Optionally, the read data may include data bits and a check bit. The data bits are test data for data checking. The test data may be preset according to a certain rule, for example, set to all be 0 or 1, or may be discrete binary data that is generated randomly. The check bit is calculated according to the data bits. Specifically, the check bit may be generated based on parity check, or ECC check, or CRC.

The check bit is written into the memory array together with the data bits. Correspondingly, the check bit is read out together with the data bits when the memory array is read. Here, an error may occur in the check bit. The number of check bits may be increased to improve fault tolerance. In practical applications, ECC involves more check bits than the parity check, and thus is higher in fault tolerance. In addition, the read data includes the check bit, and error data may be corrected by use of the check bits. Regarding a method for correcting a detected EB, reference may be made to the related art, and the method is not specifically introduced herein.

It is to be noted that, in a data transmission process, one or more frames transmitted on a link may be damaged, that is, a bit error occurs, for example, 0 changes to 1, or 1 changes to 0, such that a receiver receives error data. In order to improve the accuracy of data received by the receiver, error detection is performed on the data before the receiver receives the data, and the receiver receives the data only if a detection result indicates that the data is correct. In the above-mentioned parity check, ECC checking, CRC, etc., the check bit is set to implement error detection.

Specifically, the first compressed data is obtained by compressing the read data, and the second compressed data is obtained by compressing the written data corresponding to the read data. Compared with comparing each bit of original bit data in the written data and each bit of original bit data in the read data, checking with the compressed data reduces a data amount involved in comparison, and improves the testing efficiency greatly.

Furthermore, when the compressed data in the read data is consistent with the compressed data in the written data, a condition that incorrect ⊕ incorrect=correct (⊕ represents the exclusive- or operation) may occur during compression based on exclusive- or operation, for example, a compression result for data bits of all 0 and a compression result for data bits of all 1 are 1, so a case that the read data is all incorrect is impossible to be determined. Therefore, original bit data at a position in the written data and original bit data at a position in the read data same as the position in the written data is compared for further determination. When the extracted and compared original bit data in the written data and the read data are inconsistent, it indicates that the read data is incorrect. Otherwise, it indicates that the read data is correct. Compared with comparing compressed data only, the case that the read data is all incorrect can be determined, thereby improving the accuracy for data checking. Compared with performing bit-wise comparison between original bit data in the written data and original bit data in the read data, though two determination operations are executed, the data amount to be processed is far smaller than that in the bit-wise comparison, thereby improving the testing efficiency.

Figure 9:
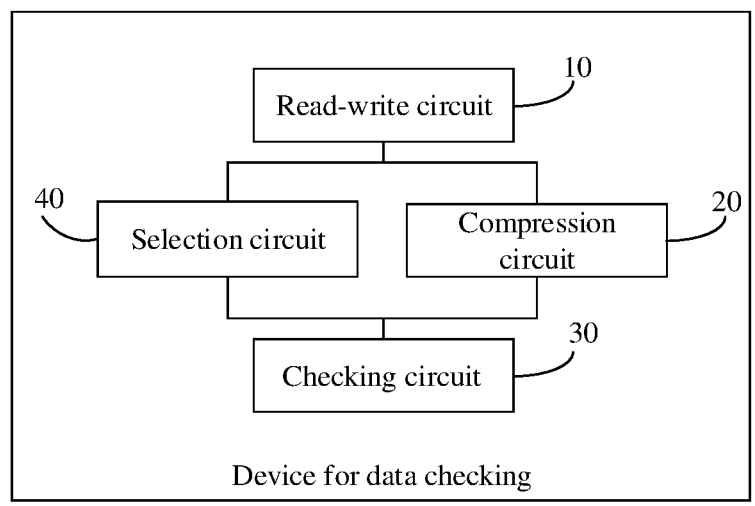
FIG. 9 is a schematic structural diagram of another device for checking data according to an embodiment of the disclosure.

FIG. 9 is a schematic structural diagram of another device for checking data according to an embodiment of the disclosure. The device includes a compression circuit 20, a selection circuit 40 and the read-write circuit 10. The compression circuit 20 is configured to compress the written data to obtain the second compressed data. The selection circuit 40 is configured to extract data of the predetermined bit in the written data. The read-write circuit 10 is further configured to store the second compressed data and the data of the predetermined bit in the written data, and write the written data to the memory array.

Before the written data is written into the memory array, the written data is compressed to obtain the second compressed data, the data of the predetermined bit is selected, and the second compressed data and the data of the predetermined bit are stored in a register. Alternatively, the second compressed data corresponding to the written data and the data of the predetermined bit are stored in the register when the written data is written into the memory array. Timing of obtaining and storing the second compressed data corresponding to the written data and the data of the predetermined bit is not limited in the embodiment of the disclosure.

Optionally, the second compressed data corresponding to the written data and the data of the predetermined bit may be stored in a register of a peripheral circuit inside a DRAM chip, which improves an integration level of the device for checking data. Alternatively, the data may be stored in a register outside the DRAM chip, which allows more data to be stored. Alternatively, the data may be written into the memory array of the DRAM chip.

In practical applications, when spaces of both the register and the memory array of the DRAM chip are relatively small, the register outside the DRAM chip may be selected for storage. When a memory space of the DRAM chip is sufficient, the register or the memory array inside the DRAM chip may be selected for storage. The positions for storing the second compressed data corresponding to the written data and the data of the predetermined bit are not limited in the embodiment of the disclosure.

Furthermore, since the first compressed data is compared with the second compressed data, identical compression calculation methods are performed on the first compressed data and the second compressed data. The compression of the written data or the read data may be implemented by a logic circuit, or a program code.

In a possible implementation, the compression circuit 20 is configured to divide the written data into multiple parts of data according to data amount of the second compressed data. The compression circuit 20 is further configured to perform compression processing based on an exclusive- or operation on each bit of data in each part of data to obtain compression results of the multiple parts of data. The compression result includes 1-bit data. The compression circuit is configured to obtain the second compressed data according to the compression results of the multiple parts of data.

Specifically, a memory BANK having a bit line BL=8 is taken as an example. The written data is, for example, 256+16 bits data, namely including 256-bit data bits and generated 16-bit check bits. A compression ratio is, for example, 34:1, that is, the data amount of the second compressed data is 8 bits. The 255+16 bits written data is divided into eight parts, and each part of data may be the same or different in data amount. An exclusive- or operation is performed on each part of data to obtain a 1-bit exclusive-or result EB. Therefore, the eight parts of data correspond to eight exclusive- or results, denoted as EB0 to EB7, to form the second compressed data.

In a practical test, a proper compression ratio may be set freely according to requirements for the test speed and the accuracy, which is not limited in the embodiment of the disclosure. The amount of the written data may be set adaptively according to the DRAM chip to be tested, which is not limited in the embodiment of the disclosure.

Based on the above-mentioned implementation, the compression circuit 20 is further configured to divide each part of data into multiple parts of sub-data. A data amount of each part of sub-data is equal to that corresponding to each burst in the memory array. The compression circuit 20 is further configured to perform, for each part of sub-data, an exclusive- or operation on each bit of data in the sub-data to obtain an intermediate compression result of the sub-data. The compression circuit 20 is further configured to, for each part of data, perform an exclusive- or operation on the intermediate compression results of the multiple parts of sub-data of the part of data, to obtain the compression results of the multiple parts of data.

Specifically, based on the division of the (256+16) bit written data into eight parts, each part of data is divided into multiple parts of sub-data. Taking BL=8 as an example, each part of sub-data includes a data amount corresponding to a burst, i.e., 8 bit. In such case, the data amount of each part of data is a multiple of 8 bits. If data of the data amount corresponding to a burst is taken as a Column Plane (CP), the (256+16) bit written data is divided into 34 parts of sub-data, and compression based on the exclusive- or operation is performed on each bit of data in each part of sub-data to generate a 1-bit intermediate compression result, recorded as CP0 to CP33.

Furthermore, the exclusive- or operation is performed on CP0 to CP3 to obtain 1-bit second compressed data, i.e., EB<0>=CP0⊕CP1⊕CP2⊕CP3 (⊕ represents exclusive- or operation). The number of CPs corresponding to EB is an integer.

In the practical test, the amount of data in the sub-data may be set adaptively according to a burst length of the DRAM chip to be tested, which is not limited in the embodiment of the disclosure. The number of CPs corresponding to each EB and participating in exclusive- or calculation is not limited in the embodiment of the disclosure.

In a possible implementation, the checking circuit 30 is further configured to, after the compression circuit compresses the read data to obtain the first compressed data, determine a read error in responsive to that the first compressed data is inconsistent with the second compressed data. It is easily understood that, when the first and second compressed data are inconsistent, it indicates that original bit data corresponding to the compressed data is partially incorrect. Furthermore, in order to locate an error bit, bit-wise comparison may be performed between original bit data of the written data and original bit data of the read data, or more compressed data (with a low compression ratio) may be set to further reduce a range of the error bit. The above checking by comparing the compressed data reduces the data amount involved in comparison, and improves the test rate greatly.

Optionally, simple data may be set as the test data. For example, when the written data is all 0 or 1, an EB<7:0> of the second compressed data may be obtained easily, and in the practical test, the second compressed data may be directly given without performing the above-mentioned compression calculation. Therefore, the calculation time is shortened greatly, and the testing efficiency is improved. In addition, it facilitates the rapid location of an EB. If the written data is all 0, a bit 1 in the read data is an error bit. Certainly, it is not excluded that the error bit is not displayed due to twice flipping. The checking accuracy may be improved by multiple tests.

When the test data is set, it is necessary to ensure that results outputted when the read data is all correct and partially incorrect are different. Specifically, when the read data is partially incorrect, the incorrect bit may be detected by a comparison logic circuit. For example, when the read data is all correct, the comparison logic circuit outputs 1 to represent that checking is passed. When the read data is partially incorrect, the comparison logic circuit outputs 0 to represent that checking is not passed. However, when the read data is all incorrect, the comparison logic circuit may output an error result. That is, when the read data is all incorrect, 1 is outputted. Alternatively, 0 represents that checking is passed, and 1 represents that checking is failed.

Exemplarily, FIG. 3 is a circuit diagram of a comparison logic circuit according to an embodiment of the disclosure, which is applied to a test scenario where it is known that written data is all 0 or 1. In the logic circuit shown in FIG. 3, Data<0> and Data<1> are inputted into an input end of an exclusive-not- or circuit 15, and Data<2> and Data<3> are inputted into an input end of an exclusive-not- or circuit 14, Data<0> and Data<3> are inputted into an input end of an exclusive-not- or circuit 13. An exclusive-not- or circuit 12 is a redundant circuit, output end of which is 1, thereby achieving layout symmetry. For the exclusive-not- or circuit, when values of the input ends are identical, an output is 1, and when the values of the input ends are different, the output is 0. Outputs of output ends of the exclusive-not- or circuits 15 and 14 are inputted into a not- and circuit I1. Output of output ends of the exclusive-not- or circuits 13 and 12 are inputted to a not- and circuit I0. Outputs of output ends of the not- and circuits I1 and I0 are inputted to a not- or circuit 16. The not- or circuit 16 outputs 1 or 0 to represent that the read data is correct or incorrect.

It can be seen from FIG. 3 that the logic circuit is configured to output 1 to represent that checking is passed and output 0 to represent checking is failed. It is to be noted that a similar logic circuit may also be set to output 0 to represent that checking is passed and output 1 to represent that checking is failed, which is not limited in the disclosure.

It can be seen from the analysis on the logic circuit that the logic circuit outputs 1 when Data<3:0> is all 0 or 1, otherwise outputs 0. That is, the read data does not pass checking when being partially incorrect, and may pass checking when being all correct or incorrect. In such case, it is necessary to further obtain a value of any data of Data<3:0> to determine whether the data is all correct or incorrect.

When the first compressed data is consistent with the second compressed data, considering the influence of the exclusive- or operation during compression on the analysis on conditions that the read data is all incorrect and correct, the comparison on the data of the predetermined bit in S300 is performed. Multiple bits of uncompressed original bit data are checked, and if inconsistent error data is extracted, it may indicate that the first compressed data EB does not satisfy a condition that the data is all correct.

FIG. 4 is a timing diagram of compressing read data of a DRAM according to an embodiment of the disclosure. Compared with FIG. 1, after eight bits of EB data EB<7:0> are compressed and read, two bits of Burst Bit (BB) data BB<1:0> are added in the data signal TDQ in FIG. 4. In FIG. 4, the EB data is the first compressed data, and the BB data is the data of the predetermined bit, i.e., original bit data. The BB data is some bits in the read data, that is, the BB data is not subjected to an exclusive- or logic. The condition that the data in the memory array is all incorrect is determined by checking the outputted original bit data.

When a smaller amount of BB data is extracted, an error may occur in a reading process, so the read data may still be correct even if the stored data is all incorrect. That is, multiple bits of original bit data are needed for checking. When a larger amount of BB data is extracted, the probability of extracting error data is higher, and the test time is prolonged. The amount of the extracted BB data is not limited in the embodiment of the disclosure, and the test efficiency, the accuracy and other problems need to be considered comprehensively in the practical test.

In order to balance the test time and the test coverage, part of data is selected to be outputted through a test mode.

In a possible implementation, any burst data is randomly extracted as the data of the predetermined bit. This mode is simpler and more convenient.

In a possible implementation, the selection circuit 40 is further configured to determine a bit of which an error rate exceeds a predetermined threshold by simulation testing according to sample data. The selection circuit 40 is further configured to determine a bit of which the error rate exceeds the predetermined threshold as the predetermined bit. FIG. 5 is a flowchart of obtaining original bit data according to an embodiment of the disclosure. Exemplarily, in the test mode, two bits of original bit data are selected from multiple bits of original bit data as BB data by a data selection circuit. Specifically, historical data error records may be obtained in a simulation test mode, to obtain and output BB data in a region with more errors. BB data is preferably obtained from a bit with a high error rate, and a position with a high error rate is pertinently detected, which is more favorable for extracting error data, and contributes to improving the accuracy of data checking and the detection efficiency.

For the selection of the BB data, BB data is selected when data is written, and BB data at the same position as the selected BB data is read for comparison when data is read. Alternatively, BB data is selected when data is read, and then BB data is extracted from the written data, and in such case, the written data needs to be stored in the register in advance so as to be accessed and extracted anytime. Alternatively, the written data is set to be preset default data, such as all 0 or 1, and thus may be obtained without real-time access.

The extracted BB data may be written to the register when data is written, or may be a preset default value. For example, when the written data is all 0 or 1, it is unnecessary to extract BB data from the written data. Therefore, checking operations may be simplified, and the testing efficiency may be improved.

Furthermore, the original bit data is stored in a register. Specifically, in a possible implementation, the original bit data may be stored in a register outside the DRAM. In another possible implementation, a register is added to a peripheral circuit inside the DRAM chip, and the data checking device is further integrated into the DRAM, thereby facilitating the improvement of a data checking function of the DRAM. The original bit data (BB data) is stored in the register of the peripheral circuit inside the DRAM. In practical applications, the amount and storage positions of the original bit data (BB data) to be deposited are coordinated in consideration of a die size, memory space, and other aspects of the DRAM.

FIG. 6 is a flowchart of a method for checking data under a write operation according to an embodiment of the disclosure. When test data written from external is written into the memory array (Array) of the DRAM, data BB<7:0> of a burst length in the test data written from external is written to an internal register of the DRAM. FIG. 7 is a flowchart of a method for checking data under a read operation according to an embodiment of the disclosure. When data is read from the memory array (Array) of the DRAM, BB data stored in the DRAM is read and compared with the read data by a comparison circuit. Error information is output in a case that the BB data is inconsistent with the read data.

In the embodiment of the disclosure, in addition to comparing the compressed data corresponding to the written data with the compressed data corresponding to the read data, original bit data of a predetermined bit in the written data and original bit data of a predetermined bit in the read data are extracted and compared in a case that the compressed data corresponding to the written data is consistent with the compressed data corresponding to the read data, to further determine whether the read data has an error, thereby improving the accuracy of data checking.

Figure 10:
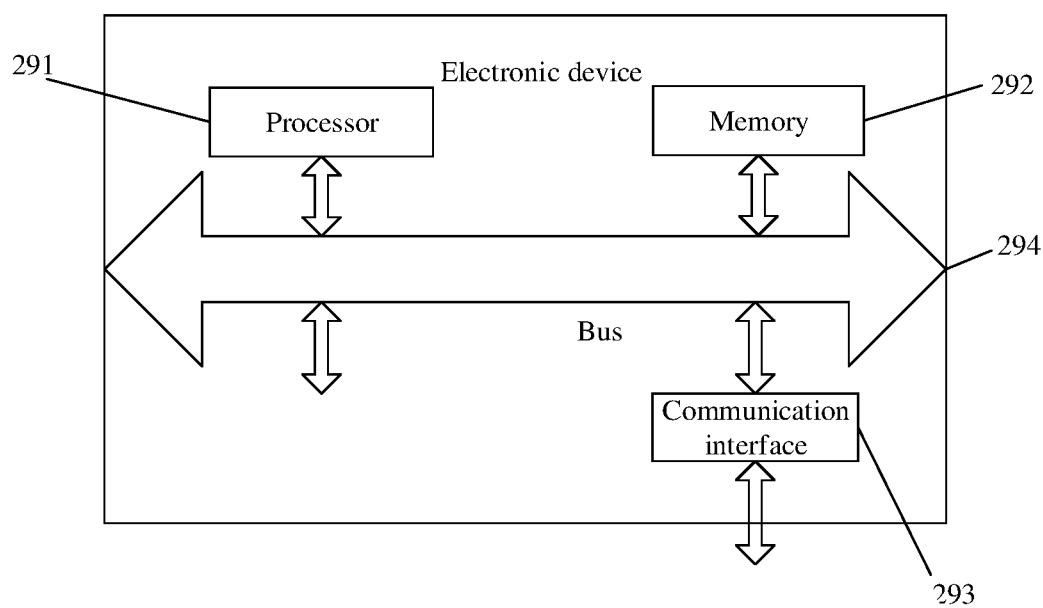
FIG. 10 is a schematic structural diagram of an electronic device according to an embodiment of the disclosure.

FIG. 10 is a schematic structural diagram of an electronic device according to an embodiment of the disclosure. As shown in FIG. 10, the electronic device includes a processor 101, a memory 292, a communication interface 293 and a bus 294.

The processor 291, the memory 292 and the communication interface 293 may communicate with one another through the bus 294. The communication interface 293 may be configured for information transmission. The processor 291 may call logic instructions in the memory 292 to execute the method in the above-mentioned embodiment.

In addition, the logic instructions in the memory 292 may be stored in a computer-readable storage medium when being implemented in form of a software function unit and sold or used as an independent product.

As a computer-readable storage medium, the memory 292 may be configured to store a software program and a computer-executable program, e.g., a program instruction/module corresponding to the method in the embodiment of the disclosure. The processor 291 runs the software program, instruction and module stored in the memory 292, to execute function applications and data processing, that is, for implementing the method in the method embodiment.

The memory 292 may include a program storage region and a data storage region. The program storage region may store an operating system and an application program needed by at least one function. The data storage region may store data created according to the use of a terminal device. In addition, the memory 292 may include a high-speed random access memory, or a nonvolatile memory.

The disclosure provides a computer-readable storage medium having stored therein computer-executable instructions which, when executed by a processor, are used for implementing the method provided in the embodiment.

Other implementation solutions of the disclosure are apparent to those skilled in the art after considering the specification and practicing the disclosure disclosed here. The disclosure is intended to cover any transformations, uses, or adaptive variations of the disclosure, and these transformations, uses, or adaptive variations follow the general principle of the disclosure, and include common general technical means which are not disclosed in the disclosure in this technical field. The specification and the embodiments are only considered as examples, and the practical scope and spirit of the disclosure are pointed out by the appended claims.

It is to be understood that the disclosure is not limited to the precise structures described above and shown in the drawings, and various modifications and variations may be made without departing from the scope thereof. The scope of the disclosure is only defined by the appended claims.

The invention claimed is:

1. A method for checking data, applied to a memory and comprising:
   reading a memory array to obtain read data, and compressing the read data to obtain first compressed data;
   comparing the first compressed data with second compressed data, wherein the second compressed data is obtained by compressing written data corresponding to the read data;
   detecting, in responsive to that the first compressed data is consistent with the second compressed data, whether data of a predetermined bit in the read data is consistent with pre-stored original bit data to determine whether the read data is correct; and
   determining, in responsive to that the data of the predetermined bit in the read data is consistent with the pre-stored original bit data, that the read data is correct, and determining, in responsive to that the data of the predetermined bit in the read data is inconsistent with the pre-stored original bit data, that the read data is incorrect, wherein the original bit data is data of the predetermined bit in the written data corresponding to the read data; and, wherein the method further comprises:
   compressing the written data to obtain the second compressed data;
   extracting the data of the predetermined bit in the written data; and
   storing the second compressed data and the data of the predetermined bit in the written data, and writing the written data into the memory array.

2. The method of claim 1, further comprising:
   determining, by simulation testing according to sample data, a bit of which an error rate exceeds a predetermined threshold; and
   determining the bit of which the error rate exceeds the predetermined threshold as the predetermined bit.

3. The method of claim 1, wherein the compressing the written data to obtain the second compressed data comprises:
   dividing the written data into multiple parts of data according to a data amount of the second compressed data;
   performing, for each part of data, compression processing based on an exclusive- or operation on each bit of data in the part of data, to obtain compression results of the multiple parts of data, the compression result comprising 1-bit data; and
   obtaining the second compressed data according to the compression results of the multiple parts of data.

4. The method of claim 3, wherein the performing, for each part of data, the compression processing based on an exclusive- or operation on each bit of data in the part of data to obtain compression results of the multiple parts of data comprises:
   dividing each part of data into multiple parts of sub-data, wherein a data amount of each part of sub-data is equal to data amount corresponding to each burst in the memory array;
   performing, for each part of sub-data, an exclusive- or operation on each bit of data in the part of sub-data to obtain an intermediate compression result of the sub-data; and
   performing, for each part of data, an exclusive- or operation on the intermediate compression results of the multiple parts of sub-data of the part of data, to obtain the compression results of the multiple parts of data.

5. The method of claim 1, wherein the original bit data is stored in a register.

6. The method of claim 1, further comprising: after the compressing the read data to obtain first compressed data,
   determining that the read data is incorrect in responsive to that the first compressed data is inconsistent with the second compressed data.

7. A computer-readable storage medium having stored therein computer-executable instructions which, when executed by a processor, are used for implementing the method of claim 1.

8. A device for checking data, comprising:
   a read-write circuit configured to read a memory array to obtain read data;
   a compression circuit configured to compress the read data to obtain first compressed data; and
   a checking circuit configured to:
   compare the first compressed data with second compressed data, wherein the second compressed data is obtained by compressing written data corresponding to the read data;
   detect, in responsive to that the first compressed data is consistent with the second compressed data, whether data of a predetermined bit in the read data is consistent with pre-stored original bit data to determine whether the read data is correct; and
   determine, in responsive to that the data of the predetermined bit in the read data is consistent with the pre-stored original bit data, that the read data is correct, and determine, in responsive to that the data of the predetermined bit in the read data is inconsistent with the pre-stored original bit data, that the read data is incorrect, wherein the original bit data is data of the predetermined bit in the written data corresponding to the read data;
   the compression circuit further configured to compress the written data to obtain the second compressed data,
   a selection circuit configured to extract the data of the predetermined bit in the written data; and
   the read-write circuit configured to store the second compressed data and the data of the predetermined bit in the written data, and write the written data into the memory array.

9. The device of claim 8, wherein
   the selection circuit is further configured to determine, by simulation testing according to sample data, a bit of which an error rate exceeds a predetermined threshold; and
   the selection circuit is further configured to determine the bit of which the error rate exceeds the predetermined threshold as the predetermined bit.

10. The device of claim 8, wherein the compression circuit is configured to:
    divide the written data into multiple parts of data according to a data amount of the second compressed data;

perform, for each part of data, compression processing based on an exclusive- or operation on each bit of data in the part of data, to obtain compression results of the multiple parts of data, the compression result comprising 1-bit data, and obtain the second compressed data according to the compression results of the multiple parts of data.

11. The device of claim 10, wherein the compression circuit is further configured to:

divide each part of data into multiple parts of sub-data, wherein a data amount of each part of sub-data is equal to data amount corresponding to each burst in the memory array;

perform, for each part of sub-data, an exclusive- or operation on each bit of data in the part of sub-data to obtain an intermediate compression result of the sub-data; and perform, for each part of data, an exclusive- or operation on the intermediate compression results of the multiple parts of sub-data of the part of data, to obtain the compression results of the multiple parts of data.

12. The device of claim 8, wherein the original bit data is stored in a register.

13. The device of claim 8, wherein the checking circuit is further configured to, after the compression circuit compresses the read data to obtain the first compressed data, determine that the read data is incorrect in responsive to that the first compressed data is inconsistent with the second compressed data.

14. An electronic device, comprising:

a processor; and a memory in communication connection with the processor, wherein the memory stores computer-executable instructions; and the processor executes the computer-executable instructions stored in the memory to implement:

reading a memory array to obtain read data, and compressing the read data to obtain first compressed data;

comparing the first compressed data with second compressed data, wherein the second compressed data is obtained by compressing written data corresponding to the read data;

detecting, in responsive to that the first compressed data is consistent with the second compressed data, whether data of a predetermined bit in the read data is consistent with pre-stored original bit data to determine whether the read data is correct; and determining, in responsive to that the data of the predetermined bit in the read data is consistent with the pre-stored original bit data, that the read data is correct, and determining, in responsive to that the data of the predetermined bit in the read data is inconsistent with the pre-stored original bit data, that the read data is incorrect, wherein the original bit data is data of the predetermined bit in the written data corresponding to the read data; and, wherein the processor executes the computer-executable instructions stored in the memory to implement:

compressing the written data to obtain the second compressed data;

extracting the data of the predetermined bit in the written data; and storing the second compressed data and the data of the predetermined bit in the written data, and writing the written data into the memory array.

15. The electronic device of claim 14, wherein the processor executes the computer-executable instructions stored in the memory to implement:

determining, by simulation testing according to sample data, a bit of which an error rate exceeds a predetermined threshold; and determining the bit of which the error rate exceeds the predetermined threshold as the predetermined bit.

16. The electronic device of claim 14, wherein the processor executes the computer-executable instructions stored in the memory to implement:

dividing the written data into multiple parts of data according to a data amount of the second compressed data;

performing, for each part of data, compression processing based on an exclusive- or operation on each bit of data in the part of data, to obtain compression results of the multiple parts of data, the compression result comprising 1-bit data; and obtaining the second compressed data according to the compression results of the multiple parts of data.

17. The electronic device of claim 16, wherein the processor executes the computer-executable instructions stored in the memory to implement:

dividing each part of data into multiple parts of sub-data, wherein a data amount of each part of sub-data is equal to data amount corresponding to each burst in the memory array;

performing, for each part of sub-data, an exclusive- or operation on each bit of data in the part of sub-data to obtain an intermediate compression result of the sub-data; and performing, for each part of data, an exclusive- or operation on the intermediate compression results of the multiple parts of sub-data of the part of data, to obtain the compression results of the multiple parts of data.

* * * * *